(12) United States Patent
Kondo et al.

(10) Patent No.: US 6,401,163 B1
(45) Date of Patent: Jun. 4, 2002

(54) APPARATUS AND METHOD FOR REWRITING DATA FROM VOLATILE MEMORY TO NONVOLATILE MEMORY

(75) Inventors: Haruhiko Kondo, Anjo; Hirokazu Komori, Okazaki, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/321,585

(22) Filed: May 28, 1999

(30) Foreign Application Priority Data

Jul. 1, 1998 (JP) .......................................... 10-185804

(51) Int. Cl.⁷ ...................... G06F 12/00; H02K 19/003; H02K 10/00
(52) U.S. Cl. ..................... 711/100; 711/162; 711/156; 711/143; 714/6; 714/15
(58) Field of Search .................................. 711/100, 102, 711/103, 104, 162, 156, 143; 714/2, 5, 6, 15, 24

(56) References Cited

U.S. PATENT DOCUMENTS

| | | | | |
|---|---|---|---|---|
| 4,959,774 A | * | 9/1990 | Davis ......................... 364/200 |
| 5,023,813 A | * | 6/1991 | Brown, III .................. 364/519 |
| 5,247,669 A | * | 9/1993 | Abraham et al. ........... 395/600 |
| 5,682,471 A | * | 10/1997 | Billings et al. ......... 395/182.13 |
| 5,708,589 A | * | 1/1998 | Beauvais ..................... 364/492 |
| 5,884,211 A | * | 3/1999 | Pauli ........................... 701/115 |
| 5,913,219 A | * | 6/1999 | Baek et al. .................. 707/202 |
| 5,964,813 A | * | 10/1999 | Ishii ............................. 701/35 |
| 6,091,658 A | * | 7/2000 | McDonald .................. 365/228 |
| 6,167,338 A | * | 12/2000 | De Wille et al. ............. 701/51 |

FOREIGN PATENT DOCUMENTS

JP     A-5-289949     11/1993

* cited by examiner

Primary Examiner—Do Hyun Yoo
Assistant Examiner—Kimberly McLean
(74) Attorney, Agent, or Firm—Nixon & Vanderhye PC

(57) ABSTRACT

In an electronic control system having a CPU, a RAM and an EEPROM, an original data stored in the EEPROM is written into the RAM to be updated in a control calculation processing of the CPU. If the updated data is the type which is to be written back into the EEPROM, a writing request is issued at the same time of writing into the RAM and an address and size of the updated data are also written into the RAM as a related data. Actual rewriting of the updated data into the EEPROM is executed based on the related data in a separate data rewriting processing in response to the writing request. Thus, interruption of the application processing for the data rewriting into the EEPROM can be shortened, and the updated data can be prevented from being broken and lost even upon instantaneous power-off.

30 Claims, 4 Drawing Sheets

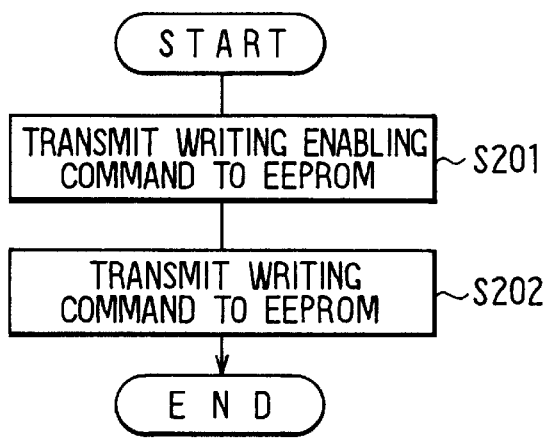
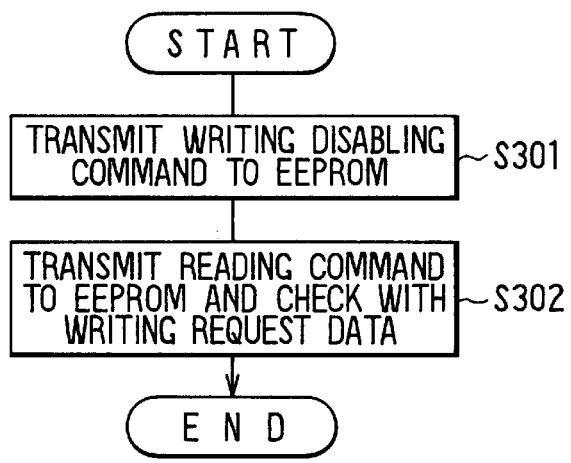
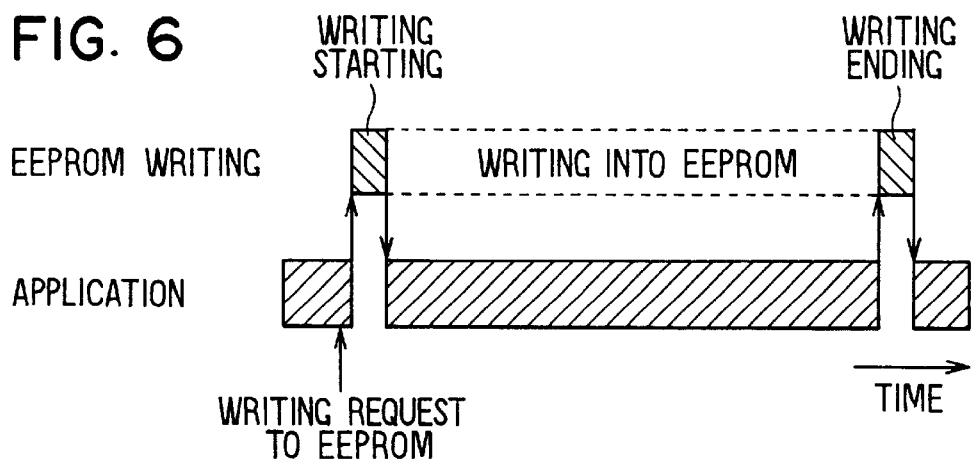

APPARATUS AND METHOD FOR REWRITING DATA FROM VOLATILE MEMORY TO NONVOLATILE MEMORY

CROSS REFERENCE TO RELATED APPLICATION

This application relates to and incorporates herein by reference Japanese Patent Application No. 10-185804 filed on Jul. 1, 1998.

BACKGROUND OF THE INVENTION

1. Field of the Invention

The present invention relates to a memory data writing apparatus and method, and more particularly to an apparatus and method for rewriting a latest updated data into a rewritable nonvolatile memory.

2. Related Art

In an electronic control system for vehicles, a rewritable nonvolatile memory is used to store various data for controlling a control object. For instance, original data stored in a rewritable nonvolatile memory such as an EEPROM is transferred to and written into a readable/rewritable volatile memory such as a RAM by an initial setting operation at the time of power-on of an electronic computer, so that a control object is controlled using the data transferred from the nonvolatile memory and stored in the volatile memory. Latest updated data stored in the volatile memory is transferred to and written back into the nonvolatile memory again at the time of power-off of the computer. This operation is necessary, because nonvolatile memories have a limitation in the number of writing operations and is not capable of writing data from time to time as opposed to volatile memories.

More specifically, the computer executes its programmed application processing as shown in FIGS. 7 and 8. That is, original data stored in an EEPROM 16 is transferred to and written into the storage area (A) 131 of a RAM 13 in the initial setting operation at step S401 (①in FIG. 8). Then, when this data is to be written back into the EEPROM 16, it is written into the storage area (A) 131 of the RAM 13 at step S402 (③ in FIG. 8). When the updated data in the EEPROM 16 is to be read out, it is read out from the storage area (A) 131 of the RAM 13 at step S403 (④ in FIG. 8). Finally, in the power-off operation, the latest updated data stored in the RAM 13 is written back into the EEPROM 16 at step S404 (② in FIG. 8).

If some data, which may be a vehicle identification code or vehicle diagnosis results, are broken or lost due to accidental power-off or the like before or during writing back of the latest data into the nonvolatile memory, the vehicle can not be operated or the vehicle diagnosis can not be attained later. It is therefore proposed to compare the data in the nonvolatile memory and the data in the volatile memory at shortest possible time interval, and to write back the data stored in the volatile memory into the nonvolatile memory when those data differ from each other. However, as the time period required to the writing data into the nonvolatile memory is longer than a normal control program processing time period, the computer must interrupt its control program processing for the execution of the writing processing as shown in FIG. 9. This interruption for the data writing into the nonvolatile memory (EEPROM) in the course of the application processing is disadvantageous, because the control program processing is desired to be executed for a real time control on the control object.

SUMMARY OF THE INVENTION

It is an object of the present invention to provide an improved memory data writing apparatus and method which are free from the above disadvantage.

It is a further object of the present invention to provide a memory data writing apparatus and method which enable writing back of data into a nonvolatile memory without affecting a control program execution.

According to the present invention, an original data stored in a nonvolatile memory is written into a volatile memory to be updated in a control calculation processing of a CPU. If the updated data is the type which is to be written back into the nonvolatile memory again, a writing request is issued at the same time of writing the updated data into the volatile memory and an address and size of the updated data are also written into the volatile memory as a related data. Actual rewriting of the updated data into the nonvolatile memory is executed based on the related data in a separate data writing processing in response to the writing request.

BRIEF DESCRIPTION OF THE DRAWINGS

Other objects, features and advantages of the present invention will become more apparent from the following detailed description made with reference to the accompanying drawings. In the drawings:

FIG. 4 is a flow diagram showing an EEPROM data writing start processing in the embodiment;

FIG. 5 is a flow diagram showing an EEPROM data writing end processing in the embodiment;

FIG. 6 is a timing chart showing the application processing and the EEPROM data writing processing in the embodiment;

DETAILED DESCRIPTION OF THE PREFERRED EMBODIMENT

The present invention is described more fully with reference to an embodiment which is applied to a vehicular electronic control system.

Figure 1:
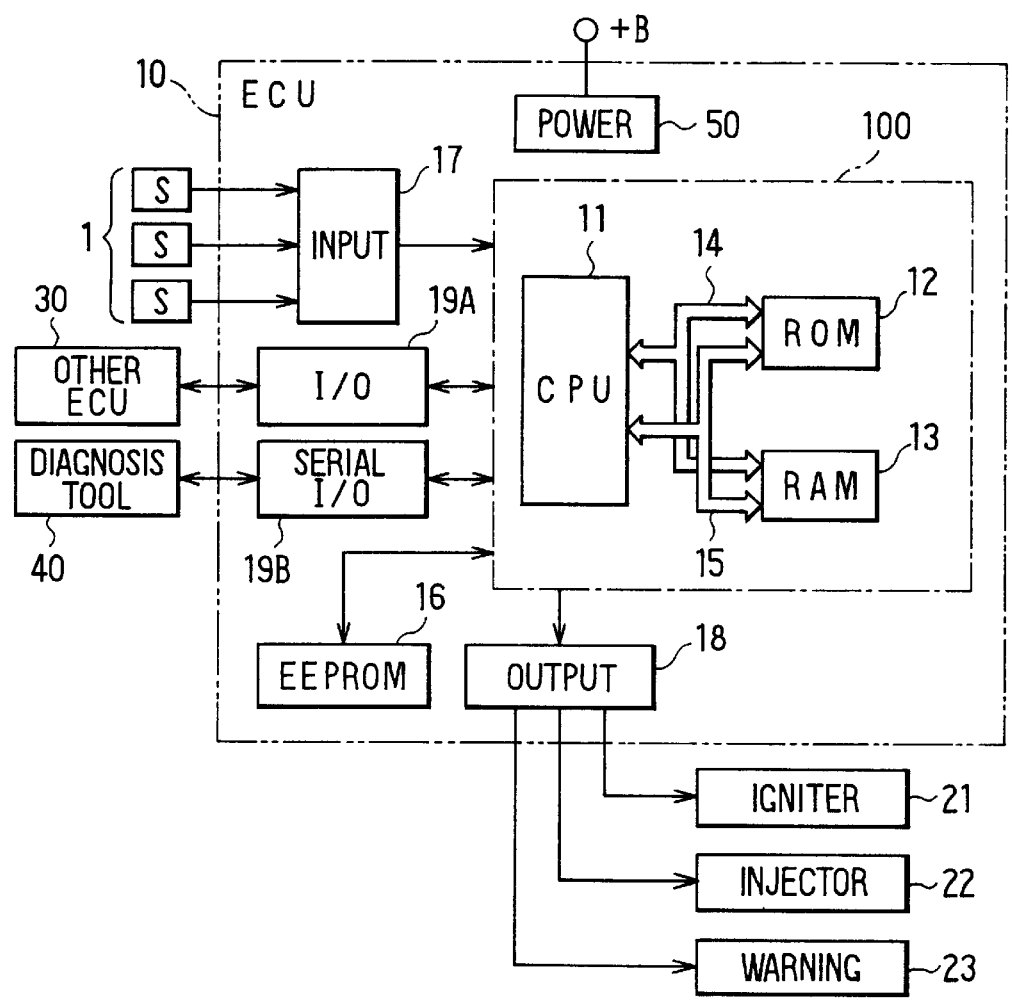
FIG. 1 is a block diagram showing a memory writing apparatus applied to a vehicular electronic control system according to an embodiment of the present invention.

Referring to FIG. 1, the vehicular electronic control system has an electronic control unit (ECU) 10. The ECU 10 includes a microcomputer 100 which is a logic arithmetic circuit. The microcomputer 100 has a central processing unit (CPU) 11, a ROM 12 which is a read only type nonvolatile memory and stores an internal combustion engine control program and other data, a RAM 13 which is a readable/rewritable volatile memory and stores various data, and an address bus 14 and a data bus 15 which connects the CPU 11, ROM 12 and RAM 13. The microcomputer 100 is connected to an electrically erasable programmable ROM (EEPROM) 16 through a serial communication line. The EEPROM 16 is an electrically readable and rewritable type nonvolatile memory.

Various sensors 1, which senses operating conditions of an internal combustion engine (not shown), which is a control object, are connected to the ECU 10, so that sensor output signals are applied to the microcomputer 100 after a signal-shaping and analog-to-digital (A/D) conversion by an input circuit 17 of the ECU 10. The CPU 11 calculates optimum control data of fuel injection, ignition and the like of the engine based on the sensor output data applied from the input circuit 17. The calculated control data are applied to an output circuit 18, so that an igniter 21, fuel injectors 22 and a warning light 23 is driven by control signals from the output circuit 18.

The microcomputer 100 is further connected to other ECUs 30 such as a vehicle theft detection ECU through an input/output (I/O) circuit 19A which inputs and outputs serial data in data communication. The microcomputer 100 is detachably connected to a diagnosis tool 40 though a serial input/output circuit 19B, so that data for failure diagnosis may be communicated when the diagnosis tool 40 is connected. The ECU 10 has a power circuit 50 which regulates a battery voltage (+B) of a vehicle-mounted battery (not shown) to an ECU operation voltage (5 V). This regulated voltage is supplied to the microcomputer 100, input circuit 17, output circuit 18 and the like.

Figure 2:
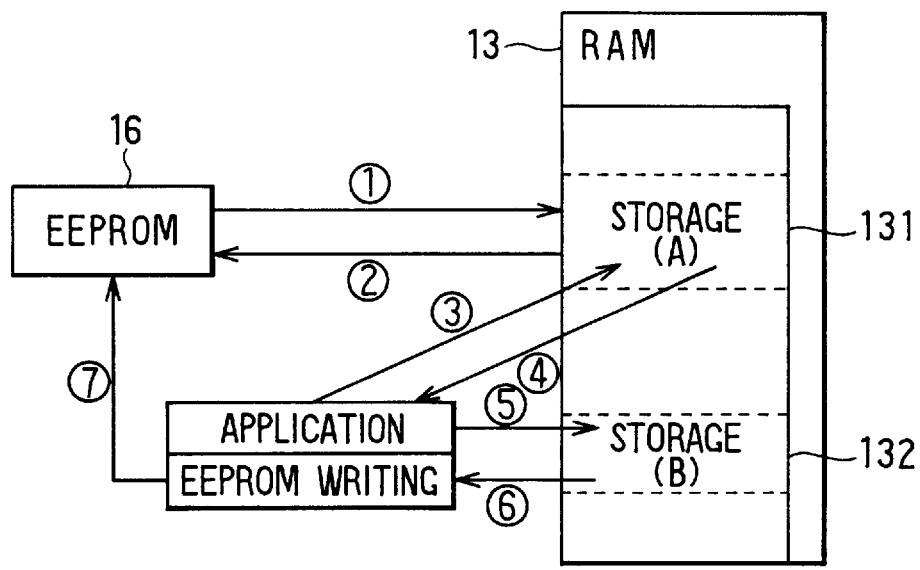
FIG. 2 is a block diagram showing a data flow between an EEPROM and a RAM during an application processing and an EEPROM data writing processing in the embodiment.

Data flow between the RAM 13 and EEPROM 16 in an application processing operation of the CPU 11 is shown in FIG. 2. The RAM 13 has a storage area (A) 131 for storing all original data stored in and transferred from the EEPROM 16, and a storage area (B) 132 for storing addresses and sizes related to updated data and necessary for writing back of the updated data into the EEPROM 16 in place of the original data.

Figure 8:
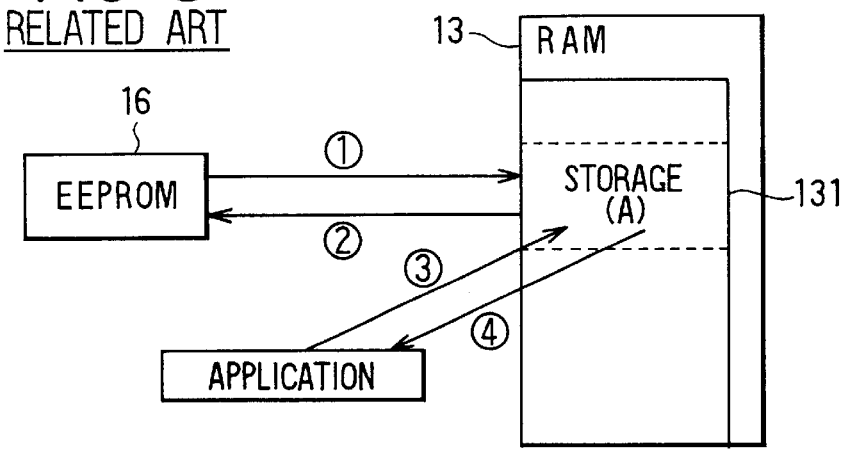
FIG. 8 is a block diagram showing a data flow between an EEPROM and a RAM during an application processing and an EEPROM data writing processing in the related art.
Figure 9:
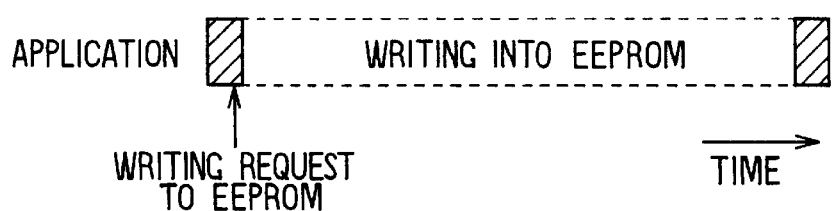
FIG. 9 is a timing chart showing the application processing and the EEPROM data writing processing in the related art.

The processing ① to ④ in this embodiment are executed by the CPU 11 in substantially the same manner as the processing ① to ④ shown in FIG. 8. The CPU 11 in this embodiment, however, executes further a processing ⑤ which is executed with the processing ③ in the application processing when the updated data is the type which is to be written back into the EEPROM 16 and processing ⑥ and ⑦ in the EEPROM writing processing. Thus, when an EEPROM data writing request to the EEPROM 16 is issued, not only is the processing ③ executed to write the data into the storage area (A) 131 of the RAM 13, but also the processing ⑤ is executed to set into the storage area (B) 132 of the RAM 13 the related data, that is, data address and size, of the updated data which is to be written into the EEPROM 16. This related data is necessitated at the time of starting updated data writing into the EEPROM 16.

Figure 3:
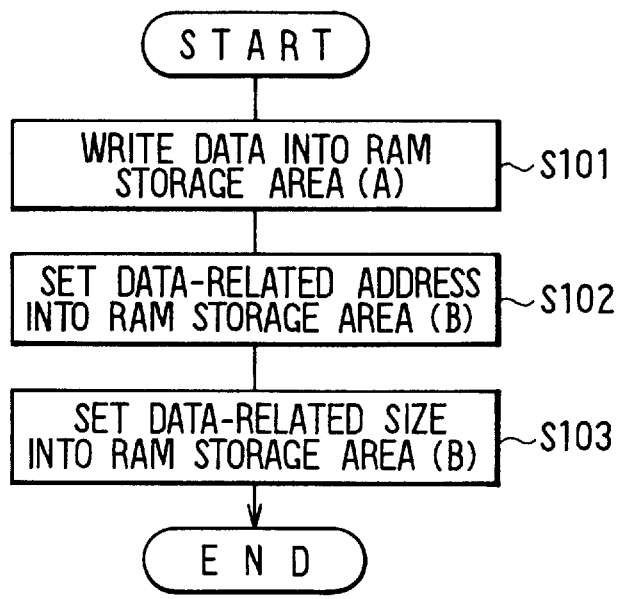
FIG. 3 is a flow diagram showing an EEPROM data writing request processing in the embodiment.
Figure 7:
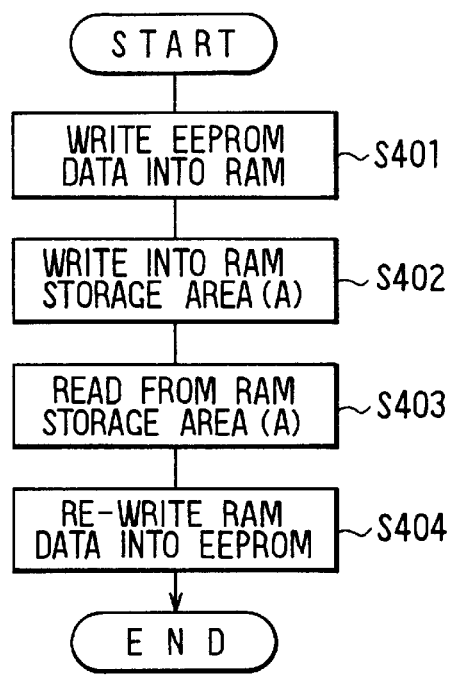
FIG. 7 is a flow diagram showing a data processing between an EEPROM and a RAM in an application processing according to a related art.

The above processing at the time of requesting the data writing to the EEPROM 16 in the application processing is described further with reference to a flow diagram shown in FIG. 3. This processing is executed by the CPU 11 when the original data used in the course of control program execution is updated and is the type which is to be written back into the EEPROM 16.

First, the updated data is written into the storage area (A) 131 of the RAM 13 at step S101. The address data of the data written into the storage area (A) 131 is also written as the related data into the storage area (B) 132 of the RAM 13 at step S102 so that this data may be used at the time of starting data writing into the EEPROM 16. The size data of the data written into the storage area (A) 131 is also written as the related data into the storage area (B) 132 at step S103, thus ending this routine.

The processing ⑦ in FIG. 2, which is an actual writing of the updated data into the EEPROM 16 is executed separately as shown in FIGS. 4 and 5 in parallel with the application processing by the CPU 11.

The processing shown in FIG. 4 is initiated in response to the request of writing into the EEPROM 16, on the condition that the related data has been written into the storage area (B) 132 of the RAM 13 in the course of the EEPROM data writing processing executed separately from the application processing of the writing request.

At step S201, a writing enabling command is transmitted to the EEPROM 16 to set a writing enabling condition. Then, a writing command is transmitted to the EEPROM 16 based on the address and size (processing ⑥ in FIG. 2) set in the storage area (B) 132 in the RAM 13 as the related data at step S202, thus ending this routine. After this routine, as shown in FIG. 6, the latest data stored in the storage area (A) 131 in the RAM 13 is actually written into the EEPROM 16.

Here, the above processing is defined to have a higher priority than the application processing of the writing request. Therefore, it is executed when the application processing is interrupted temporarily or when the writing request is confirmed at every fixed time interval. If it is to be started at the fixed time interval, it should be started at a time interval longer than the period of writing into the EEPROM 16. For instance, if the writing into the EEPROM 16 takes 10 ms, the above processing should be initiated at every 16 ms. Thus, it is prevented that the current data writing operation starts before the preceding data writing operation ends.

After the above data writing start processing and the subsequent actual data writing operation is completed, a writing end processing is executed by the CPU 11 as shown in FIG. 5.

At step S301, a writing disabling command is transmitted to the EEPROM 16 to set a writing disabling condition. Then, at step S302, a reading command is transmitted to the EEPROM 16, and it is checked whether the updated data has been written back correctly into the EEPROM 16, thus ending this routine. This processing may be executed as a writing end interrupt routine or may be initiated after an elapse of time interval from the writing start to the writing end.

According to the above embodiment, the writing request is issued at the same time of writing the updated data calculated by the CPU 11 is written into the RAM 13, if the updated data is the type which is also to be rewritten back into the EEPROM 16. This data is rewritten into the EEPROM 16 by the separate writing processing in response to the issued writing request.

Thus, when the updated data to be written back immediately into the EEPROM 16 is generated while the application processing for controlling the control object is being executed using the original data transferred from the EEPROM 6 to the RAM 13, it is only necessitated to generate the writing request in the application processing because the actual writing processing is executed in the separate writing processing. Therefore, the interruption of the application processing can be shortened. Thus, important data can be prevented from being broken or lost due to instantaneous power-off.

Further, according to the above embodiment, the address and size of the updated data to be written back into the EEPROM 16 are stored in the storage area (B) 132 of the RAM 13 as the related data of the updated data to be rewritten, and the updated data to be written is written back into the EEPROM 16 based on the related data in the separate writing processing.

Therefore, it is only necessitated to write the address and size into the RAM 13 as the writing request in the application processing for controlling the control object. As a result, the interruption of the application processing can be shortened to a minimum, and the updated data to be written back can be transferred back to the EEPROM 16 without fail based on the related data in the separate EEPROM writing processing.

The present invention should not be limited to the above embodiments, but may be implemented in many other ways without departing from the spirit and scope of the invention.

What is claimed is:

1. A memory data rewriting apparatus comprising:
   a nonvolatile memory capable of writing data;
   a volatile memory capable of reading and writing data; and
   control means programmed to write original data stored in the nonvolatile memory into the volatile memory and to write back into the nonvolatile memory at a predetermined time updated data, which is calculated using the original data in the volatile memory,
   wherein control means is programmed to issue a write request at the same time as writing the updated data into the volatile memory and to write back the updated data into the nonvolatile memory in a separate write processing different from an application processing for a control object in response to the issued write request;
   wherein the control means is further programmed to write into a predetermined storage area of the volatile memory a related data of the updated data required for writing back in response to the write request, and to write back the updated data into the nonvolatile memory using the related data in the separate write processing, the related data including address and size of the updated data; and
   wherein the control means is further programmed to execute the separate write processing in parallel with and at the same time as the application processing.

2. A memory data rewriting method comprising the steps of:
   calculating an updated data using an original data stored in a first storage area of a volatile memory, the updated data being for use in controlling a control object;
   issuing a write request in the course of the calculating step so that the updated data is written into a nonvolatile memory;
   storing both the updated data and a related data in the first storage area and a second storage area of the volatile memory, respectively, the related data being indicative of size and address of the updated data in the nonvolatile memory; and
   writing back the updated data into the nonvolatile memory based on the related data in response to the write request, the writing back step being executed in a processing separate from a processing of the issuing step in parallel with and at the same time as the calculating step.

3. A memory data rewriting method as in claim 2, further comprising the step of:
   transferring the updated data from the nonvolatile memory into the volatile memory to be used as the original data in the calculating step.

4. A memory data rewriting apparatus as in claim 1, wherein:
   the control means is further programmed to temporarily stop the application processing to start the separate processing and then restart the application processing while continuing the separate processing.

5. A memory data rewriting apparatus as in claim 4, wherein:
   the control means is further programmed to temporarily stop the application processing to end the separate processing and then restart the application processing.

6. A memory data rewriting apparatus as in claim 1, wherein:
   the control means is further programmed to store the write request when the write request is issued, to check the stored write request at every predetermined interval and to execute the separate processing in parallel with the application processing when the stored write request is confirmed.

7. A memory data rewriting apparatus as in claim 6, wherein:
   the predetermined interval is shorter than a period required for execution of the separate processing.

8. A memory data rewriting method as in claim 2, further comprising the steps of:
   temporarily stopping the calculating step to start the writing back step; and
   restarting the calculating step while continuing the writing back step.

9. A memory data rewriting method as in claim 8, further comprising:
   temporarily stopping the calculating step to end the writing back step; and
   restarting the calculating step.

10. A memory data rewriting method as in claim 2, further comprising the steps of:
    storing the write request when the write request is issued;
    checking the stored write request at every predetermined interval; and
    executing the writing back step in parallel with the calculating step when the stored write request is confirmed.

11. A memory data rewriting method as in claim 10, wherein:
    the predetermined interval is shorter than a period required for execution of the writing back step.

12. A memory data rewriting apparatus comprising:
    a nonvolatile memory capable of writing data;
    a volatile memory capable of reading and writing data; and
    a controller programmed to write original data stored in the nonvolatile memory into the volatile memory and to write back into the nonvolatile memory at a predetermined time updated data, which is calculated using the original data in the volatile memory,
    wherein the controller is programmed to issue a write request at the same time as writing the updated data into the volatile memory and to write back the updated data into the nonvolatile memory in a separate write processing different from an application processing for a control object in response to the issued write request;
    wherein the controller is further programmed to write into a predetermined storage area of the volatile memory a related data of the updated data required for writing back in response to the write request, and to write back the updated data into the nonvolatile memory using the related data in the separate write processing, the related data including address and size of the updated data; and wherein the controller is further programmed to execute separate write processing in parallel with and at the same time as the application processing.

13. A memory data rewriting apparatus comprising:

a nonvolatile memory capable of writing data;

a volatile memory capable of reading and writing data; and control means programmed to write original data stored in the nonvolatile memory into the volatile memory and to write back into the nonvolatile memory at a predetermined time updated data, which is calculated using the original data in the volatile memory, wherein the control means is programmed to issue a write request at the same time as writing the updated data into the volatile memory and to write back the updated data into the nonvolatile memory in a separate write processing different from an application processing for a control object in response to the issued write request;

wherein the control means is further programmed to execute the separate write processing in parallel with and at the same time as the application processing; and wherein the controller is further programmed to temporarily stop the application processing to start the separate processing and then restart the application processing while continuing the separate processing.

14. A memory data rewriting apparatus as in claim 13, wherein:

the control means is further programmed to temporarily stop the application processing to end the separate processing and then restart the application processing.

15. A memory data rewriting apparatus as in claim 13, wherein:

the control means is further programmed to write into a predetermined storage area of the volatile memory a related data of the updated data required for writing back in response to the write request, and to write back the updated data into the nonvolatile memory using the related data in the separate write processing.

16. A memory data rewriting apparatus comprising:

a nonvolatile memory capable of writing data;

a volatile memory capable of reading and writing data; and control means programmed to write original data stored in the nonvolatile memory into the volatile memory and to write back into the nonvolatile memory at a predetermined time updated data, which is calculated using the original data in the volatile memory;

wherein control means is programmed to issue a write request at the same time as writing the updated data into the volatile memory and to write back the updated data into the nonvolatile memory in a separate write processing different from an application processing for a control object in response to the issued write request; and wherein the control means is further programmed to execute the separate write processing in parallel with and at the same time as the application processing wherein the control means is further programmed to store the write request when the write request is issued, to check the stored write request at every predetermined interval and to execute the separate processing in parallel with the application processing when the stored write request is confirmed.

17. A memory data rewriting apparatus as in claim 16, wherein:

the predetermined interval is shorter than a period required for execution of the separate processing.

18. A memory data rewriting apparatus as in claim 16, wherein:

the control means is further programmed to write into a predetermined storage area of the volatile memory a related data of the updated data required for writing back in response to the write request, and to write back the updated data into the nonvolatile memory using the related data in the separate write processing.

19. A memory data rewriting method comprising the steps of:

calculating an updated data using an original data stored in a first storage area of a volatile memory, the updated data being for use in controlling a control object;

issuing a write request in the course of the calculating step so that the updated data is written into a nonvolatile memory;

storing both the updated data and a related data in the first storage area and a second storage area of the volatile memory, respectively, the related data being indicative of a parameter of storing the updated data in the nonvolatile memory; and writing back the updated data into the nonvolatile memory based on the related data in response to the write request, the writing back step being executed in a processing separate from a processing of the issuing step in parallel with and at the same time as the calculating step;

temporarily stopping the calculating step to start the writing back step; and restarting the calculating step while continuing the writing back step.

20. A memory data rewriting method as in claim 19, further comprising:

temporarily stopping the calculating step to end the writing back step; and restarting the calculating step.

21. A memory data rewriting method as in claim 19, further comprising:

writing into a predetermined storage area of the volatile memory a related data of the updated data required for writing back in response to the write request, and to write back the updated data into the nonvolatile memory using the related data in the separate write processing.

22. A memory data rewriting method comprising the steps of:

calculating an updated data using an original data stored in a first storage area of a volatile memory, the updated data being for use in controlling a control object;

issuing a write request in the course of the calculating step so that the updated data is written into a nonvolatile memory;

storing both the updated data and a related data in the first storage area and a second storage area of the volatile memory, respectively, the related data being indicative of a parameter of storing the updated data in the nonvolatile memory; and writing back the updated data into the nonvolatile memory based on the related data in response to the write request, the writing back step being executed in a processing separate from a processing of the issuing step in parallel with and at the same time as the calculating step;

storing the write request when the write request is issued;

checking the stored write request at every predetermined interval; and executing the writing back step in parallel with the calculating step when the stored write request is confirmed.

23. A memory data rewriting method as in claim 22, wherein:

the predetermined interval is shorter than a period required for execution of the writing back step.

24. A memory data rewriting method as in claim 22, further comprising:

writing into a predetermined storage area of the volatile memory a related data of the updated data required for writing back in response to the write request, and to write back the updated data into the nonvolatile memory using the related data in the separate write processing.

25. A memory data rewriting apparatus comprising:

a nonvolatile memory capable of writing data;

a volatile memory capable of reading and writing data; and a controller programmed to write original data stored in the nonvolatile memory into the volatile memory and to write back into the nonvolatile memory at a predetermined time updated data, which is calculated using the original data in the volatile memory, wherein the controller is programmed to issue a write request at the same time as writing the updated data into the volatile memory and to write back the updated data into the nonvolatile memory in a separate write processing different from an application processing for a control object in response to the issued write request;

wherein the controller is further programmed to execute the separate write processing in parallel with and at the same time as the application processing; and the controller is further programmed to temporarily stop the application processing to start the separate processing and then restart the application processing while continuing the separate processing.

26. A memory data rewriting apparatus as in claim 25, wherein:

the controller is further programmed to temporarily stop the application processing to end the separate processing and then restart the application processing.

27. A memory data rewriting apparatus as in claim 25, wherein:

the controller is further programmed to write into a predetermined storage area of the volatile memory a related data of the updated data required for writing back in response to the write request, and to write back the updated data into the nonvolatile memory using the related data in the separate write processing.

28. A memory data rewriting apparatus comprising:

a nonvolatile memory capable of writing data;

a volatile memory capable of reading and writing data; and a controller programmed to write original data stored in the nonvolatile memory into the volatile memory and to write back into the nonvolatile memory at a predetermined time updated data, which is calculated using the original data in the volatile memory, wherein the controller is programmed to issue a write request at the same time as writing the updated data into the volatile memory and to write back the updated data into the nonvolatile memory in a separate write processing different from an application processing for a control object in response to the issued write request;

wherein the controller is further programmed to execute the separate write processing in parallel with and at the same time as the application processing; and wherein the controller is further programmed to store the write request when the write request is issued, to check the stored write request at every predetermined interval and to execute the separate processing in parallel with the application processing when the stored write request is confirmed.

29. A memory data rewriting apparatus as in claim 28, wherein:

the predetermined interval is shorter than a period required for execution of the separate processing.

30. A memory data rewriting apparatus as in claim 28, wherein:

the controller is further programmed to write into a predetermined storage area of the volatile memory a related data of the updated data required for write back in response to the writing request, and to write back the updated data into the nonvolatile memory using the related data in the separate write processing.

* * * * *